(12) United States Patent
Deppe et al.

(10) Patent No.: US 7,977,980 B2
(45) Date of Patent: Jul. 12, 2011

(54) TIME-TO-AMPLITUDE CONVERTER COMPONENT

(75) Inventors: Harald Deppe, Erzhausen (DE); Holger Flemming, Darmstadt (DE)

(73) Assignee: GSI Helmholtzzentrum fuer Schwerionenforschung GmbH, Darmstadt (DE)

( * ) Notice: Subject to any disclaimer, the term of this patent is extended or adjusted under 35 U.S.C. 154(b) by 42 days.

(21) Appl. No.: 12/663,429

(22) PCT Filed: Jun. 4, 2008

(86) PCT No.: PCT/EP2008/004442
§ 371 (c)(1),
(2), (4) Date: Dec. 7, 2009

(87) PCT Pub. No.: WO2008/148535
PCT Pub. Date: Dec. 11, 2008

(65) Prior Publication Data
US 2010/0171530 A1    Jul. 8, 2010

(30) Foreign Application Priority Data
Jun. 8, 2007  (DE) .................... 10 2007 026 684

(51) Int. Cl.
*H03K 5/01*    (2006.01)
(52) U.S. Cl. ..................................... 327/100
(58) Field of Classification Search .............. 327/40, 327/31, 35, 100
See application file for complete search history.

(56) References Cited

U.S. PATENT DOCUMENTS

| 6,249,164 | B1 * | 6/2001 | Cranford et al. | 327/270 |
| 6,933,759 | B1 * | 8/2005 | Wu et al. | 327/172 |
| 7,564,284 | B2 * | 7/2009 | Henzler et al. | 327/261 |

FOREIGN PATENT DOCUMENTS

DE    19533414 C1    1/1997

OTHER PUBLICATIONS

Badura et al., A New TAC-Based Multichannel Front-End Electronics for TOF Experiments With Very High Time Resolution, IEEE Transactions on Nuclear Science, IEEE Service Center, New York, NY, US, vol. 52, No. 3, Jun. 1, 2005, pp. 745-747, XP011136852, ISSN:0018-9499.

(Continued)

*Primary Examiner* — Hai L Nguyen
(74) *Attorney, Agent, or Firm* — Leydig, Voit & Mayer, Ltd.

(57) ABSTRACT

A time-to-amplitude component having an integrated designed configured to measure a time difference between a start signal and a stop signal includes a first time-to-amplitude converter having a delay chain, a resistor network, a capacitor configured to be chargeable via the resistor network, and a respective driver. The component further includes a control device and a stabilizing device including a control circuit for generating a regulated control voltage. The first time-to-amplitude converter is configured so that the delay elements of the first time-to-amplitude converter are configured to be controlled by the regulated control voltage, a run signal is transmitted through the delay chain, and the capacitor is continuously charged via the resistor network, and the resistor network is electrically separated from the delay chain via the respective drivers so as to terminate a charging of the capacitor, and the analog voltage signal is measurable at an output of the capacitor.

17 Claims, 5 Drawing Sheets

OTHER PUBLICATIONS

Dudek et al., A High-Resolution CMOS Time-to-Digital Converter Utilizing a Vernier Delay Line, IEEE Journal of Solid-State Circuits, IEEE Service Center, Piscataway, NJ, US, vol. 35, No. 2, Feb. 1, 2000, XP011061177, ISSN: 0018-9200.

Ekenberg et al., An analog memory, time-to-amplitude converter and trigger logic chip for PMT applications, Nuclear Science Symposium and Medical Imaging Conference, 1994, 1994 IEEE Conference Record Norfolk, VA, USA 30 US vol. 1, Oct. 30, 1994, pp. 30-34, XP 010150192, ISBN: 978-0-7803-2544-9.

Kalisz et al., Review of methods for time interval measurements with picosecond resolution; Methods for time interval measurements, Metrologia, Institute of Physics Publishing, Bristol, GB, vol. 41, No. 1, Feb. 1, 2004, pp. 17-32, XP020019859, ISSN: 0026-1394.

Raisanen-Ruotsalainen et al., A 5 mW time-to-digital converter based on a stabilized CMOS delay line, Circuits and Systems, 1995, Proceedings, Proceedings of the 38TH Mid West Symposium on, Rio De Janeiro, Brazil. Aug. 13-16, 1995, New York, NY, USA, IEEE, US, vol. 1, Aug. 13, 1995, pp. 393-396, XP010165150, ISBN: 978-0-7803-2972-0 p. 393, col. 2, lines 20-22 p. 394, col. 1, line 47—col. 2, line 5; figure 1.

Weste et al., Principles of CMOS VLSI Design, Addison-Wesley, p. 91, 1994.

Baker et al., "CMOS Circuit Design, Layout and Simulation", IEEE Press Series on Microelectronic Systems, Wiley Interscience, p. 724-726, 1998.

Baker et al., "CMOS Circuit Design, Layout, and Simulation", IEEE Press Series on Microelectronic Systems, Wiley Interscience, p. 226, 1998.

Correia et. ai., "Delay, A 4 Channel 1/2 ns Programmable Delay Line Chip Manual", version 1.1 CERN, p. 1-9, May 2005.

Laker et al, "Design of Analog integrated Circuits and Systems", McGraw-Hill, p. 799-802, 1994.

\* cited by examiner

TIME-TO-AMPLITUDE CONVERTER COMPONENT

CROSS REFERENCE TO PRIOR APPLICATIONS

This application is the U.S. National Phase application under 35 U.S.C. §371 of International Application No. PCT/EP2008/004442, filed Jun. 4, 2008, and claims benefit to German Patent Application No. 10 2007 026 684.9, filed Jun. 8, 2007. The International Application was published in English on Dec. 11, 2008 as WO 2008/148535 under PCT Article 21(2).

FIELD

The present invention relates generally to a time-to-amplitude converter component and, in particular, to a time-to-amplitude converter component in which a capacitor is charged via a resistor network along a delay chain.

BACKGROUND

In the field of particle physics, various situations call for measuring time differences at extremely high resolutions, for example, in order to determine the velocities of elementary particles with a high degree of precision. For example, in what are generally referred to as time-of-flight (TOF) experiments, the period of time between the formation of a particle and its impinging upon a fast time-resolving detector, is determined. In this connection, what is commonly known as a start signal is generated, for example, by another time-resolving detector. The first mentioned detector likewise produces a signal that is used as a stop signal. A time-measuring instrument measures the time difference between the two signals, and, for example, the velocity of the particle can be measured based on the time difference, partly aided by other measurement data. Experts in the field refer to such a measurement as a 'coincidence measurement.' Frequently, the time-measuring instrument is also started by a detector signal and stopped by a machine clock, for example, in the case of a particle accelerator operated in pulsed mode. In this case, it is not problematic that the inverse time-of-flight is measured.

The detector signals typically undergo a plurality of processing steps in order to obtain a precise signal timing. An example of such a processing step is the use of amplifiers and discriminators. The latter output a standard signal that is in a precise temporal relationship with the corresponding detector signal. Such measuring methods, coincidence measurements and signal processing processes are reasonably well known to one skilled in the art.

Time-to-amplitude converters (abbreviated TAC) or time-to-digital converters (abbreviated TDC) are typically used as time-measuring instruments. Both measure the time difference between the start signal and the stop signal which are fed into the device in question.

Thus, a TAC typically has a start input and a stop input which each receive a transmitted standard signal. In the case of a TAC, the time difference between receipt of the start signal and the stop signal is converted into an analog voltage signal, whose signal height is typically proportional to the time difference. This analog signal can then either be further processed in analog form or, for example, be digitized by a downstream analog-digital converter (ADC). On the other hand, in the case of a TDC, the time difference is directly digitized, for example, in order to be instantaneously read out by a computer and further processed; i.e., in the case of a TDC, analog signals are not used in the process.

An example of the application of time-to-amplitude converters is particle identification using the planned CBM (Compressed Baryonic Matter) detector to be implemented in the course of the FAIR (Facility for Antiproton and Ion Research) project of the applicant. Depending on the experiment, the time-of-flight can be used to obtain information about the particles, for example, the mass, mass/charge ratio, velocity, etc., thereof. These experiments mostly require an extremely high-resolution time measurement at an accuracy well below the nanosecond region.

A time-to-amplitude converter already previously developed by the applicant is described in the German Patent DE 195 33 414 C1. FIG. 1 shows a block diagram of this type of converter, which is based on a delay chain of CMOS inverter pairs that charge a capacitor via a resistor network. Upon receipt of a start signal, a signal is transmitted through the delay chain. The capacitor is charged via a parallel array of tristate drivers and the resistor network in such a way that the capacitor voltage increases linearly over time. The tristate drivers described, for example, in N. H. E. Weste, K. Eshraghian: *Principles of CMOS VLSI Design*, Addison-Wesley, 1994 (page 91) or R. J. Baker, H. W. Li, D. E. Boyce: *CMOS Circuit Design, Layout, and Simulation* (page 226), to which reference is hereby made and whose content is incorporated by reference herein. Upon receipt of the stop signal, the tristate drivers separate the resistor network from the delay chain, and the ramp signal remains at a fixed voltage value U that is proportional to the time interval between receipt of the start signal and the stop signal. Once analog value U has been read out, the converter can be reset by a reset signal at a reset input.

For further details pertaining to such a time-to-amplitude converter, reference is made to the German Patent DE 195 33 414 C1, which is incorporated by reference herein.

H. Correia et. al: Delay, A 4 Channel ½ ns *Programmable Delay Line Chip Manual*, version 1.1 CERN, May 2005 describes coupling a delay chain as such to a DLL. However, this chip is merely used for a defined signal delay.

In principle, TAC components have been tried and tested. However, it turns out that, in view of the extreme requirements that the inventors place on accuracy and reproducibility, there is still a need for further improvement. In particular, it has become evident that the delay time of the delay elements is subject to temperature-dependent fluctuations. Moreover, it has become evident that the components are also subject to process- or charge-dependent tolerances. This means that, as long as two TAC components are produced on the same wafer, the fluctuations are relatively minor. However, if two TAC components from different wafers are compared, they disadvantageously have different delay times, which leads to a degradation of the time resolution of the converter if adequate countermeasures are not taken.

For that reason, methods have provided for recording calibration data in order to allow for these dependencies; i.e., the converters have always been at least calibrated to the prevailing ambient temperature. This process does, in fact, work, but it is involved and requires a constant temperature over the time period of the measurement.

SUMMARY

An aspect of the present invention is to provide a time-to-amplitude converter component that has a high measuring accuracy and reproducibility.

Another, alternative, aspect of the present invention is to provide a time-to-amplitude converter component that is easy to manipulate and able to be used, if indicated, without undergoing calibration, while still maintaining a high precision.

In an embodiment, the present invention provides a time-to-amplitude component having an integrated designed configured to measure a time difference between a start signal and a stop signal, wherein the time difference is converted into an analog voltage signal. The component includes a first time-to-amplitude converter having a delay chain including a plurality of delay elements, each delay element having an associated delay time, a resistor network including a respective resistor for each of the delay elements, a capacitor coupled to the respective resistors and configured to be chargeable via the resistor network, and a respective driver for each of the delay elements, wherein each of the delay elements is coupled to the respective resistor via the respective driver. The component further includes a control device having a start input and a stop input and being coupled to the delay chain and the respective drivers and a stabilizing device including a control circuit for generating a regulated control voltage and configured to stabilize a characteristic curve associated with the first time-to-amplitude converter, the first time-to-amplitude converter and the control circuit being integrated and interconnected. The first time-to-amplitude converter is configured so that the delay elements of the first time-to-amplitude converter are controlled by the regulated control voltage, a run signal is transmitted through the delay chain in response to the start signal at the start input, and the capacitor is continuously charged via the resistor network in response to the run signal so that a capacitor voltage changes according to a propagation time, and the resistor network is electrically separated from the delay chain via the respective drivers so as to terminate a charging of the capacitor in response to the stop signal at the stop input, and the analog voltage signal dependent on the time difference between the start signal and the stop signal is measurable at an output of the capacitor.

BRIEF DESCRIPTION OF THE DRAWINGS

The present invention is explained in greater detail in the following exemplary embodiments and with reference to the figures, identical or similar elements being partly indicated by the same reference numerals, and the features of various exemplary embodiments being combinable. In the drawings.

DETAILED DESCRIPTION

Figure 1:
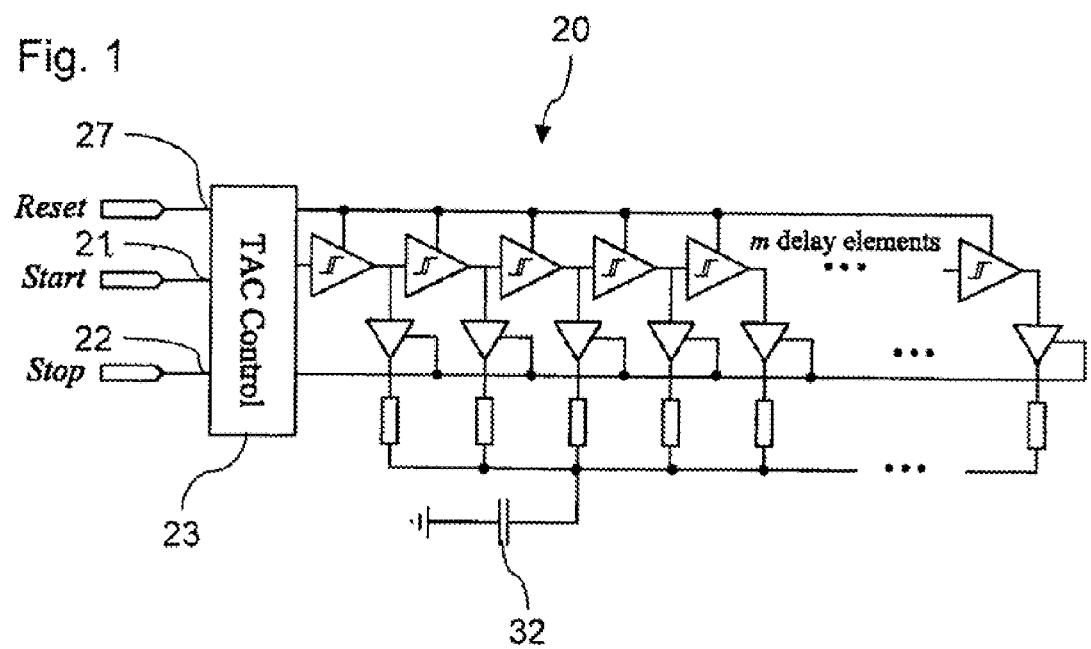
FIG. 1 shows a block diagram of a non-stabilized time-to-amplitude converter.

In accordance with an embodiment of the present invention, a time-to-amplitude converter component having an integrated design is provided for measuring a time difference between a start signal and a stop signal. The component includes at least one first time-to-amplitude converter circuit as described at the outset. Accordingly, the time-to-amplitude convener circuit includes a delay chain composed of a multiplicity of m units of substantially identical delay elements, each having a delay time $T_{del}$, so that the total delay of the delay chain corresponds to $m*T_{del}$. The delay chain is connected to a control device into which the start signals, the stop signals and the reset signals are fed and which transmits a run signal to the delay chain upon receipt of the start signal.

In addition, the time-to-amplitude converter circuit includes a multiplicity of in substantially identical tristate drivers (three-state logic modules), each tristate driver being connected to an output of a delay element in the delay chain. In addition, the tristate drivers are collectively connected to the control device in order to receive a signal from the control device in response to the receipt of the stop signal.

Moreover, the time-to-amplitude converter circuit includes a resistor network of a multiplicity of m substantially identical resistors connected in parallel, each resistor being to connected to one of the tristate drivers. In addition, the time-to-amplitude converter includes a capacitor, which is connected to the paralleled outputs of the resistors and thus is chargeable via the resistor network. It is thus achieved that, upon receipt of the start signal and release of the run signal in the delay chain, the capacitor is continuously charged via the tristate drivers and the resistor network, so that the capacitor voltage changes linearly with the propagation time, for as long as no stop signal is received. In other words, the outputs of the individual delay elements are connected via the tristate drivers to the distributed resistor-capacitor network (RC network), whereby a voltage is produced at the output of the RC network that increases proportionally with the time following the start signal. Upon receipt of the stop signal, the resistor network, controlled by the control device, is separated from the delay chain by the drivers, thereby ending the process of charging the capacitor. Thus, an analog voltage signal, which is a function of the time difference between the start signal and the stop signal and is constant following the stop signal, is retrievable at the output of the capacitor. This function represents the characteristic curve of the converter circuit and, in the ideal case, is linear, but process- and temperature-dependent.

In contrast to the time-to-amplitude converter described at the outset, the component according to an embodiment of the present invention still has a stabilizing device for stabilizing the characteristic curve of the time-to-amplitude converter that includes a separate control circuit for producing a regulated control voltage. The time-to-amplitude converter and the control circuit are each integrated and configured on the same chip. This means that the control circuit is located outside of the time-to-amplitude converter circuits, but on the same chip, and the control circuit and the time-to-amplitude converter circuits are interconnected. By configuring the control circuit (DLL or PLL) on the same chip as the time-to-amplitude converter, it is achieved that both have the same temperature. Thus, the control circuit produces a temperature-compensated control voltage which is used to control the delay elements of the time-to-amplitude converter.

In this manner, delay time $T_{del}$ of each delay element is advantageously regulated by the external control voltage in such a way that the temperature dependency and the process dependency are substantially eliminated or at least reduced. Thus, an aspect of the present invention makes it possible to utilize the advantages of a time-to-amplitude converter for high-resolution time measurement, without having to accept the disadvantage of temperature dependency.

The control circuit is very functionally designed as a locked loop circuit, in particular, as a delay locked loop (DLL) circuit or as a phase locked loop (PLL) circuit.

The locked loop circuit contains a delay chain having multiplicity of k units of delay elements and a phase detector, it being possible for the regulated control voltage for the time-to-amplitude converter to be tapped off at the phase detector and led out of the locked loop circuit and conducted to the time-to-amplitude converter. Thus, this regulated or phase difference-stabilized control voltage is used as control voltage for the time-to-amplitude converter. In other words, the delay elements of the locked loop circuit and of the time-to-amplitude converter are driven by the same control voltage that has been stabilized in both instances by the locked loop circuit. In this context, the delay elements of the locked loop circuit are identical to those of the time-to-amplitude converter. CMOS inverter pairs have proven to be effective as delay elements. Thus, in each case, delay elements composed of two inverters are used, and the delay elements of the time-to-amplitude converter are controlled by an external reference signal from the locked loop circuit in order to stabilize the delay chain relative to process and temperature fluctuations. To generate the control voltage, a charge pump and a loop filter are also located downstream of the phase detector.

Preferably, the control circuit and the time-to-amplitude converter are operative in response to the same clock signal, the system clock. Depending on the resolution desired for the converter, the clock frequency of the system clock should be greater than 10 MHz.

In the case of a delay locked loop circuit, the delay chain of the control circuit is preferably composed of an even number n=2*k of inverters, and the delay time of the delay chain of the delay locked loop circuit is an integral multiple of the cycle time of the injected clock signal. It is especially preferred that the integral multiple be equal to one.

The number of delay elements of the time-to-amplitude converter should be greater than or equal to the number of delay elements of the delay locked loop circuit, i.e., m≧k. However, it is advantageous to select the number of delay elements of the time-to-amplitude converter to be actually greater than the number of delay elements of the delay locked loop circuit. This advantageously makes it possible to avoid disturbing effects caused by non-linearities in the time-to-amplitude converter circuit in the start and end region of the output voltage ramp.

Alternatively to the DLL circuit, a PLL circuit may also be used, which then includes a ring oscillator composed of an uneven number n=2k+1 of inverters.

In accordance with an embodiment of the present invention, the component includes two or more substantially identically designed, parallel time-to-amplitude converter circuits that are integrated on the same chip. This allows the delay chains of the plurality of time-to-amplitude converter circuits to be controlled by the same control circuit using the same regulated control voltage, so that merely one control circuit is provided for a plurality of time-to-amplitude converter circuits, thereby reducing the outlay for circuit engineering.

It is also beneficial to connect two or more time-to-amplitude converter circuits at the respective analog voltage outputs thereof via a switch and a buffer. Thus, it is alternately possible for one of the converters to be read out at the buffer output, while the other converter(s) is/are ready for measurement. In the case of the time-to-amplitude converter component according to an embodiment of the present invention, a plurality of clock signals, which are in an exact and stable mutual phase relation, are used for the further processing of the analog output signals of the two or more time-to-amplitude converter circuits, in particular, for some charge transfer and switching processes, as well as for the sequence control, which regulates the access of the two or more time-to-amplitude converter circuits to the shared output.

Such multiphase clock signals are able to be derived exceptionally well from the DLL circuit. Thus, in the component according to the present invention, the DLL has a dual function: compensating for the temperature of the time-to-amplitude converters and generating a multiphase clock pulse for various control logics on the chip.

Figure 2:
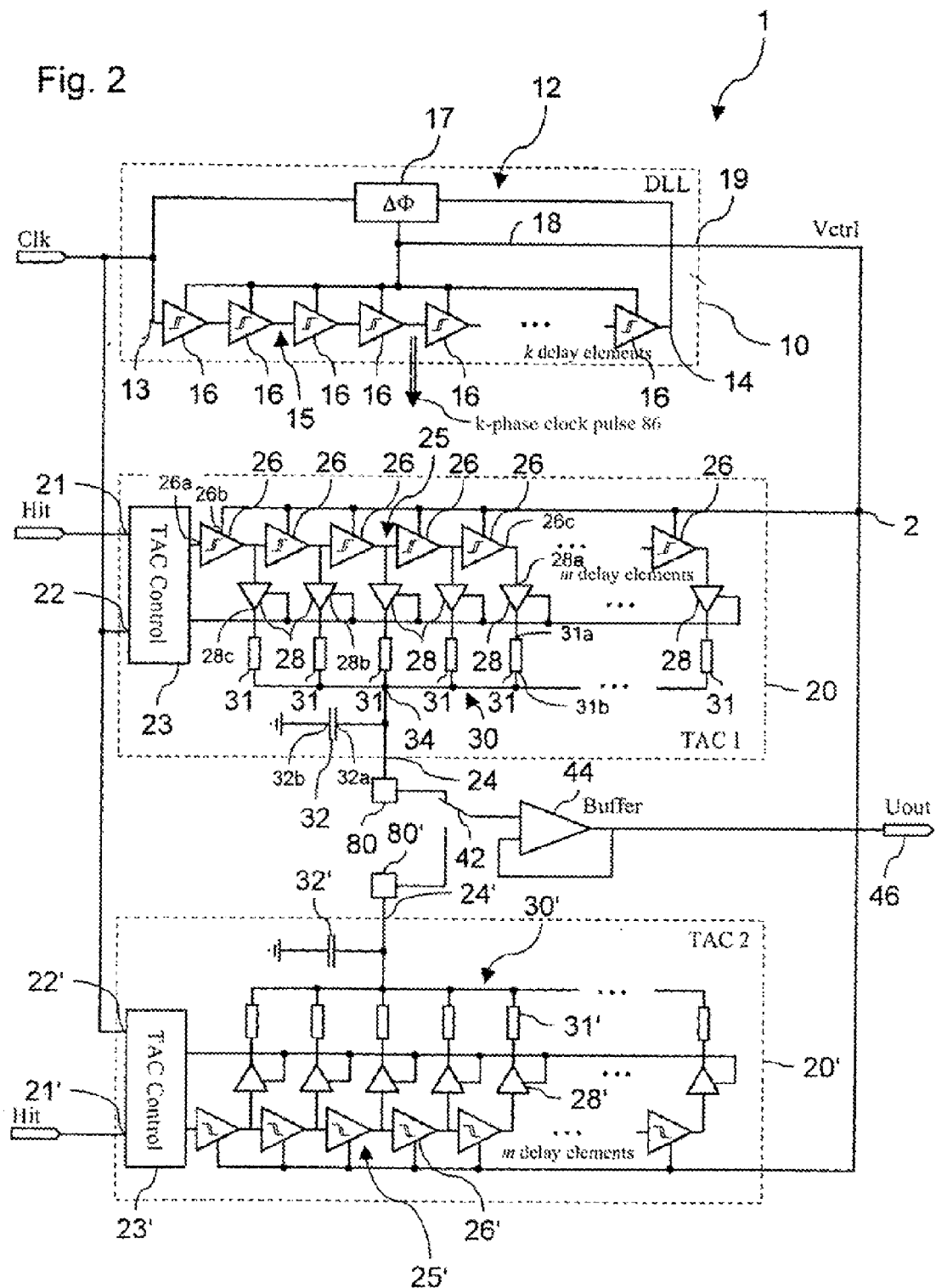
FIG. 2 shows a block diagram of a time-to-amplitude converter component according to an embodiment of the present invention in the form of an ASIC.

To conduct a practical trial of an embodiment of the present invention, one developed an application-specific integrated circuit (ASIC) 1 containing the components, including stabilizing device 10 and two time-to-amplitude converter circuits 20 and 20'. FIG. 2 shows a block diagram of this integrated circuit 1. For a time reference, a DLL circuit 12 was selected as a control circuit of stabilizing device 10. The DLL circuit is operated off of an external system clock Clk. From phase difference ΔΦ between input signal 13 and output signal 14 of delay chain 15, composed of k delay elements 16, phase detector 17 generates a control voltage 18 or $V_{ctrl}$, which is led out of the DLL, is branched at branch point 2 and, in this example, is conducted to two time-to-amplitude converters 20 and 20'. Moreover, following each delay element 16, a clock signal is tapped off, so that the DLL additionally delivers a phase-stable k-phase clock pulse 86 which is used for timing purposes.

In addition, integrated circuit 1 includes the two time-to-amplitude converters 20 and 20' (TAC1 and TAC2), as are described in the introductory part of the specification with reference to FIG. 1. The description of the TAC1 20 design in the following also relates to identically designed TAC2 20' that is indicated by the same reference numerals, but includes an inverted comma.

TAC1 20 includes a delay chain 25 of m units of identical delay elements 26, each in the form of two controllable inverters described in greater detail in the following with reference to FIG. 4. CMOS inverter pairs 26 are each connected at output 26c thereof to input 26a of the next inverter pair and to an input 28a of a tristate driver 28. Thus, each CMOS inverter pair 26 drives the one that follows next. Tristate drivers 28 are interconnected at input 28b thereof and are connected to control device 23 in order to be switched into their third indifferent or high-ohmic state upon receipt of a stop signal, so that, in response to the stop signal, delay chain 25 is separated from resistor network 30. The resistor network is composed of m paralleled identical resistors 31, which are each connected at input 31a thereof to output 28c of corresponding tristate driver 28 that is switchable to high-ohmic. Outputs 31b of resistors 31 are interconnected, so that outputs 28c of tristate drivers 28 are connected via a corresponding resistor 31 to summation or star point 34. Star point 34, in turn, is connected to one side 32a of a capacitor 32 that is grounded on other side 32b. In other words, one delay element 26, one tristate driver 28 and one resistor 31 each are connected in parallel to star point 34, in order to continuously charge capacitor 32 linearly, for as long as the start-induced run signal is propagating through delay chain 25 and tristate drivers 28 have not yet been stop-induced to switch to high-ohmic.

As is also shown in FIG. 2, inputs 26b of CMOS inverter pairs 26 are collectively connected to control voltage output 19 of DLL circuit 12, so that each inverter pair 26 is controlled by the same regulated control voltage $V_{ctrl}$ that is external to the TAC. By coupling delay elements 26 to DLL control voltage 18, it is ensured that the delay time of delay elements 26 is largely independent of temperature and process variations.

Both time-to-amplitude converters 20, 20' on chip 1 receive separate start signals (hit) at start input 21, respectively 21'. For this test measurement, the stop signals were generated from system clock Clk and were each transmitted to stop input 22, respectively 22' of control device 23 designated as "TAC control." In this example, the control device or control logic 23 stores the incoming start and stop signals or pulses. Moreover, when a cyclical clock pulse is used as a stop signal, as in the case of this test chip 1, control block 23 selects the next rising edge of this system clock signal to stop the particular converter 20, 20'.

Output voltage $U_{out}$ produced by converters 20, 20' at TAC output 24, 24', respectively, is a measure of time span $\Delta\tau$ between the start signal and the stop signal and, in the exemplary embodiment illustrated in FIG. 2, is directed via a switched-capacitor attenuator (abbreviated SC attenuator) 80, 80', which is clarified in greater detail in the following with reference to FIGS. 7 and 8, as well as via a switch 42 and a buffer 44 to output 46 of integrated circuit 1. Buffer 44 contains an amplifier which is used, inter alia, for impedance coupling between the RC chains in TACs 20, 20' and the devices into which analog voltage signal $U_{out}$ is injected, for example, an ADC (not shown).

In an embodiment shown as ASIC 1, a DLL circuit 12 having k=32 delay elements 16, i.e., having n=2*k=64 inverters, is selected. Thus, at a system clock rate of 80 MHz, a delay time of 390.6 ps is obtained per delay element 16. In this example, system clock Clk is used as a stop signal. Therefore, time-to-amplitude converters 20, 20' have a dynamic range of at least one cycle time. Thus, it holds for the number of delay elements in the converter that m≧k. To prevent the start and stop from occurring in immediate succession, m=48=1.5*k>k was selected. Depending on the system requirements, other parameters are also possible, as will be readily apparent to one skilled in the art.

The reset input of TAC control 23, 23', still indicated in FIG. 1, is omitted in FIG. 2. The signal at the reset input is generated by a complex sequence control which uses a reset signal to reset the TAC when the charge from capacitor 32 has been transferred to SC attenuator 80. In this context, a precise synchronization with the aid of k-phase clock pulse 86 prevents a reset from occurring before all of the charge has been received from capacitor 32. Thus, the resetting of time-to-amplitude converter 20, 20' in question is synchronized by k-phase clock pulse 86.

This sequence control, which also communicates with the SC attenuator, is omitted in FIG. 2 for the sake of clarity, since there is no correlation between it and the temperature compensation of the TACs.

However, time-to-amplitude converters 20, 20', respectively control devices 23, 23' may also be configured to include a separate start input, stop input and reset input, as is illustrated in FIG. 1. The reset signal is used, inter alia, to reset tristate drivers 28 out of the high-ohmic state again.

Figure 3:
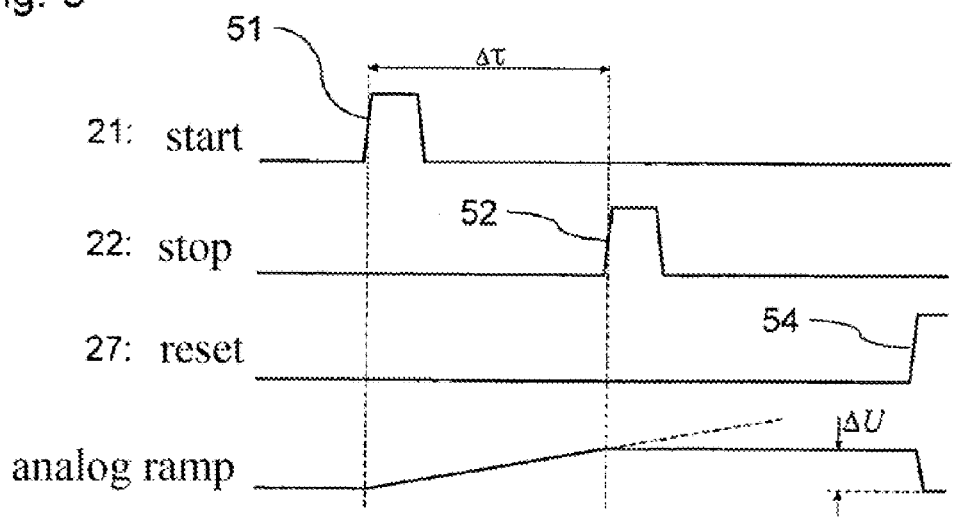
FIG. 3 shows a flow diagram of the time-to-amplitude conversion.

FIG. 3 shows a flow diagram of the time-to-amplitude conversion. When start signal 51 is received at start input 21, converter 20 begins to charge capacitor 32. The charging process is complete when stop signal 52 is received at stop input 22 following time $\Delta\tau$ after start signal 51. In this example, capacitor 32 is charged. However, given a suitably adapted design, the capacitor may be discharged, starting from a defined voltage, so that, in this case, "charge" is understood to mean "charge" or "discharge". Due to the analog interpolation, in this method, the time resolution is not limited by the defined delay time of a delay element 26.

Thus, the analog ramp is always differentiable, in particular linearly, between the start and stop signal. Therefore, time resolutions significantly better than 10 ps may be achieved using time-to-amplitude converters 20 of this kind. Once analog voltage $\Delta U$ downstream of buffer 44 has been read out as analog voltage signal $U_{out}$, time-to-amplitude converter circuit 20, 20' is again switched into operational readiness by a reset signal 54 at a reset input 27 of control device 23, in that, inter alia, tristate drivers 28 are reset and capacitor 32 is restored to its original—in this case, discharged—state.

Figure 4:
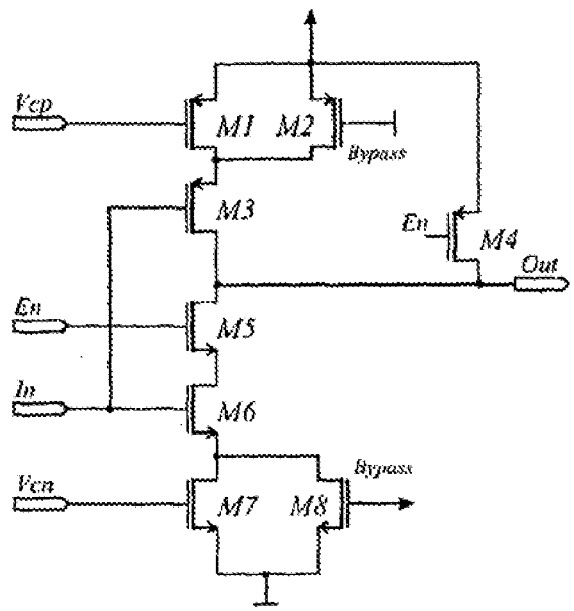
FIG. 4 a circuit diagram of an inverter having controllable delay.

An inverter of a delay element 16, 26, 26' is shown in detail with reference to FIG. 4. Two series-connected inverters in accordance with FIG. 4 form an inverter pair 16, 26, 26' having a controllable delay time. The delay time is controlled via control voltages $V_{cn}$ and $V_{cp}$. Transistors M3 through M6 form a NAND gate, thereby realizing an enable mechanism for the delay element. For as long as the En input is inactive (logic 0), the output remains stably connected to the operating voltage via transistor M4. Only when enable signal En is active (logic 1), does M4 inhibit and M5 become conductive, so that transistors M3 and M6 form an inverter for input signal In, and the inverted input signal is present at output Out following the defined delay time. The maximum current that is able to flow through this inverter is limited by transistors M1 and M7 and may be controlled by the control voltages present at the gates of these transistors. Thus, the delay time, which is derived from the current flow and the load capacitance at the output of the element and the resultant time constant of the charge-change process in the case of a state change, is also indirectly varied by these voltages. Based on the previously described relation, the fluctuation in the delay time is derived from the temperature and process dependency of the current flow through the transistors and the process dependency of the load capacitances.

Bypass transistors M2 and M8 ensure that transistors M1 and M7 are not able to completely inhibit the current flow through the inverter. A minimal current will always flow through M2 and M8.

In accordance with an embodiment of the present invention, the delay time of this element in the time-to-amplitude converter is derived from a known reference time, namely, via delay locked loop (DLL) circuit 12 shown in FIG. 2. Alternatively, a phase locked loop (PLL) circuit may also be used.

Figure 5A:
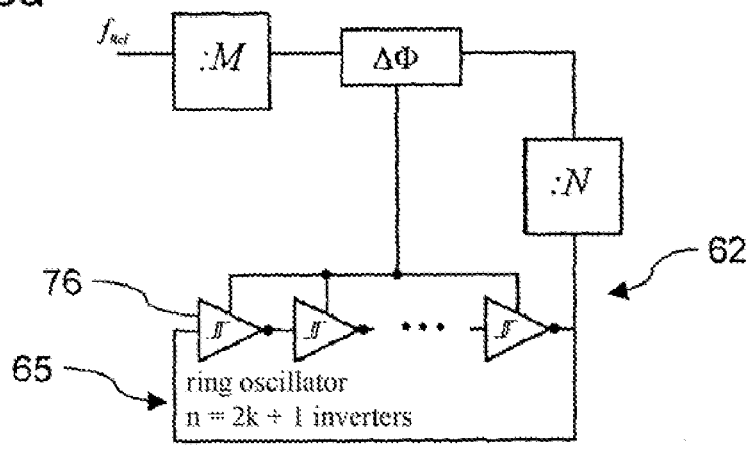
FIG. 5a shows a block diagram of a PLL circuit.
Figure 5B:
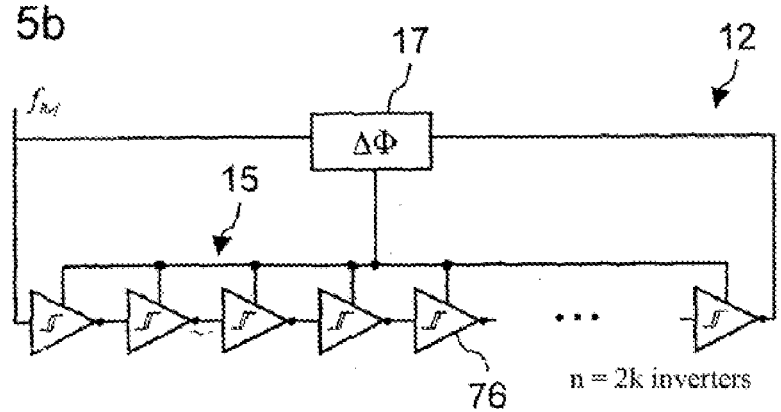
FIG. 5b shows a block diagram of a DLL circuit.

Exemplary PLL and DLL circuits are shown with reference to FIGS. 5a and 5b. The DLL circuit in FIG. 5b corresponds to that in FIG. 2.

With reference to FIG. 5a, in the case of a PLL circuit 62, the phase of a controllable oscillator 65 is compared to the phase of a reference frequency signal $f_{Ref}$, and oscillator 65 is readjusted in such a way that phase difference $\Delta\Phi$ disappears. For stabilizing device 10 required here, a ring oscillator composed of an uneven number of the described inverters 76 is used as controllable oscillator 65. DLL circuit 12 in FIG. 2 may be replaced by PLL circuit 62. Accordingly, through the use of frequency dividers, any given rational relationships may be achieved between reference frequency $f_{Ref}$ and the oscillator frequency. In the adjusted state, delay time $t_{del}$ of an inverter 76 is expressed as:

$$t_{del} = \frac{M}{nNf_{Ref}} \quad (1)$$

A DLL circuit 12, as is used in FIG. 2, is shown with reference to FIG. 5b. In a DLL circuit, incoming reference signal $f_{Ref}$, which is implemented in FIG. 2 by clock signal Clk, is delayed by delay chain 15, which is composed of an even number of inverters 76. Connected at the output of delay chain 15 is a phase detector 17 which compares the phase angle of the signal at the output of chain 15 with that at the input of chain 15 and thereby readjusts control voltage $V_{ctrl}$ of inverters 76 in such a way that phase difference $\Delta\Phi$ disappears. Thus, the PLL and the DLL circuits may both be described as locked loop circuits, more precisely, as phase difference-controlled locked loop circuits. Through the use of the DLL circuit, the delay time of chain 15 generally corresponds precisely to an integral multiple of the cycle time of injected clock signal Clk having frequency $f_{Ref}$. For the most part, DLL circuit 12 is designed in such a way that precisely one cycle time results as the delay time.

Thus, delay time $t_{del}$ of an inverter 76 is given by the cycle time of clock signal $T_{cyc}$ and the number of inverters n in chain 15, as expressed by:

$$t_{del} = \frac{T_{cyc}}{n} = \frac{1}{nf_{Ref}} \quad (2)$$

In the present example, the cycle time of clock signal is $T_{cyc}$=12.5 ns=1/80 MHz. The delay time of a delay element is $T_{del}$=2*$t_{del}$=390.6 ps, and the number of delay elements 16 in the DLL circuit is k=n/2=32. In accordance with the present invention, identical delay elements 16, 26, 26', which are driven by the same control voltage, are used in the stabilizing device or reference unit 10 (PLL or DLL) and in time-to-amplitude converter 20, 20'. As a result, a delay line 25, 25' is obtained in time-to-amplitude converter 20, 20' that is stabilized relative to temperature fluctuations and manufacturing variances.

Figure 6A:
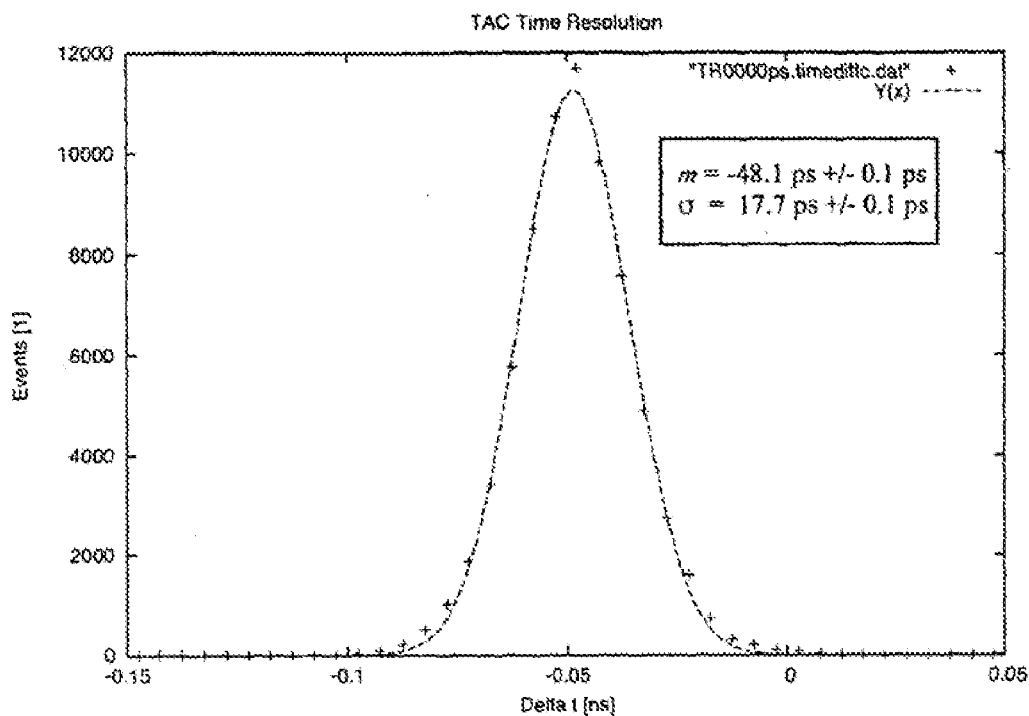
FIG. 6a shows experimental results for the time resolution of the ASIC shown in FIG. 2.
Figure 6B:
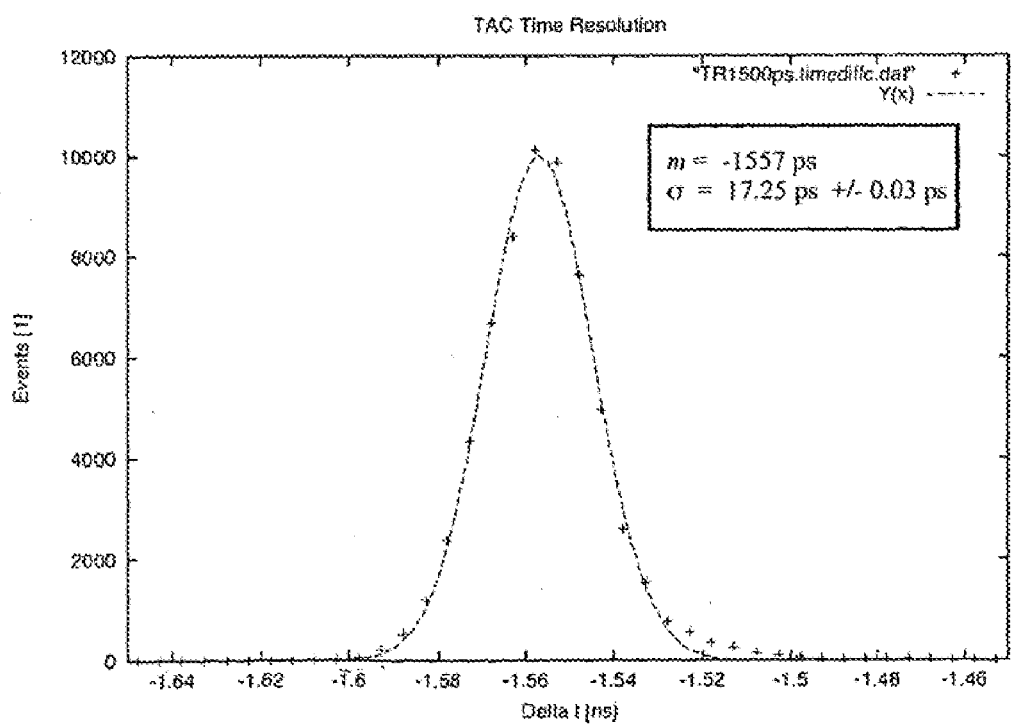
FIG. 6b shows experimental results for the time resolution of the ASIC shown in FIG. 2.

In the meantime, chip 1 illustrated in FIG. 2 is manufactured as an ASIC. First measurements indicate that the coupling of delay line 25 to an external DLL circuit 12 functions in the anticipated fashion. FIGS. 6a and 6b show the experimentally measured time resolution of this ASIC. In FIG. 6a, a measurement is shown using synchronous hit signals and, in FIG. 6b, a measurement using hit signals which are delayed relative to one another by 1.5 ns.

In the measuring process, two time-correlated hit signals were transmitted to stabilized TAC ASIC 1, it being possible to vary the time interval between these signals System clock Clk was obtained from a separate generator, so that it is not correlated to the hit signals.

For every result, the time interval between the hit signals was measured and histogrammed using stabilized TAC ASIC 1. FIG. 6a shows the result for synchronous hit signals, and FIG. 6b for hit signals at a 1.5 ns interval. Time resolution a of two correlated channels is 17.7 ps (FIG. 6a), respectively, 17.25 ps (FIG. 6b). Thus, the uncorrelated time resolution of a single channel may be calculated as 12.2 ps, which represents an exceptional value for high-resolution time measurement.

With reference again to FIG. 2, besides control voltage $V_{ctrl}$, correspondingly delayed clock signals are tapped off at the individual delay elements 16 of DLL circuit 12, so that, given a number of k delay elements 16, a k-phase clock pulse 86 is obtained which is used in various sequence controls on the chip. Control device 23, 23' (TAC control), inter alia, is controlled by k-phase clock pulse 86.

Figure 7:
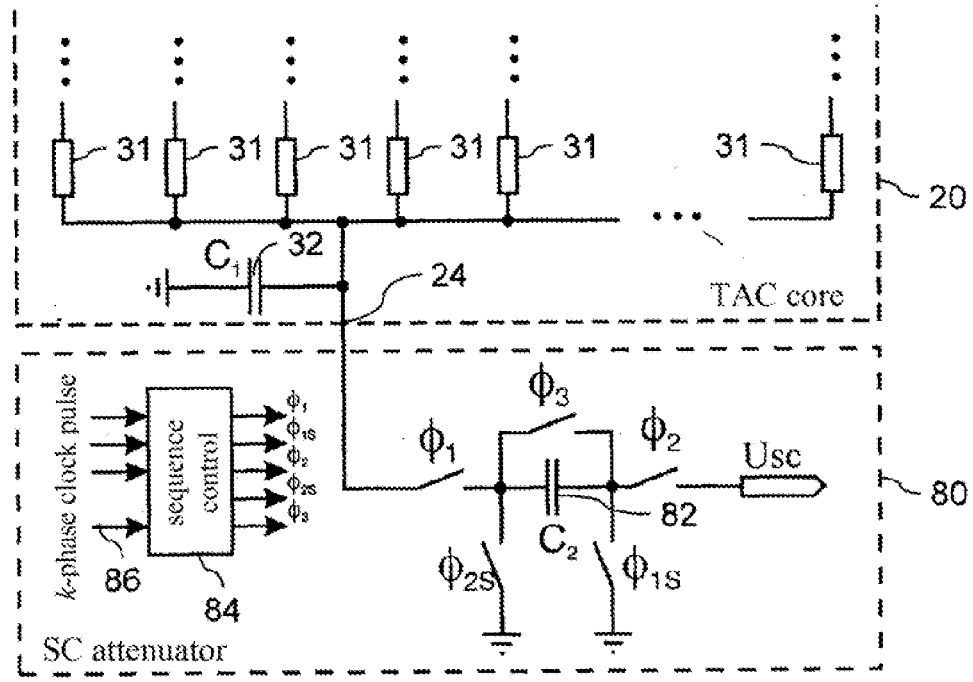
FIG. 7 is an enlarged view of FIG. 2 in the form of a block diagram of SC attenuator 80.
Figure 8:
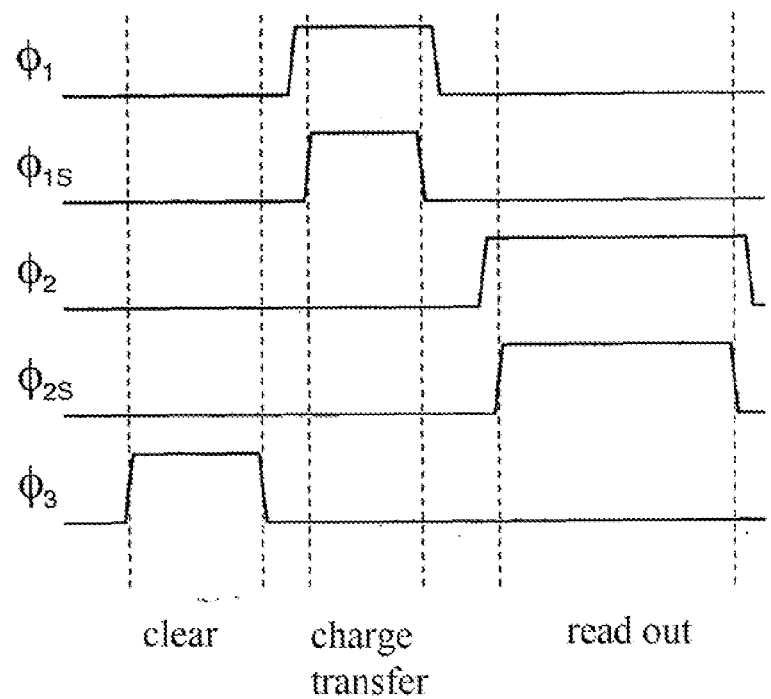
FIG. 8 is a flow diagram of the charge transfer and of the SC attenuation.

With reference to FIGS. 7 and 8, k-phase clock pulse 86 is used, in particular, for the sequence control of the two identically designed SC attenuators 80, 80'.

The output voltage of TAC1 20 is able to cover the full range of the operating voltage. Such signals, generally referred to as rail-to-rail signals, are exceedingly difficult to process with the requisite linearity on an ASIC, which is why an attenuator 80, which functions on the basis of switched capacitances (SC attenuator), was inserted between TAC1 20 and output buffer 44. A block diagram of SC attenuator 80 assigned to first TAC1 20 and connected to its analog voltage output 24 is shown in FIG. 7. Attenuator 80 has a capacitor 82, whose capacitance $C_2$ is in a predefined ratio to capacitance $C_1$ of charging capacitor 32 in TAC1 20 (designated as TAC core in FIG. 7). Capacitor 82 may be switched in parallel to capacitor 32 by switches $\Phi_1$ and $\Phi_{1S}$. On the other hand, capacitor 82 is connected to output $U_{sc}$ of SC attenuator 80 by switches $\Phi_2$ and $\Phi_{2S}$.

To bring capacitor 82 to a defined initial state, it may be short-circuited by switch $\Phi_3$ and thus discharged.

Switches $\Phi_1$ through $\Phi_3$ are driven by a sequence control 84 which receives k-phase clock pulse 86 derived from DLL circuit 12 to ensure a precise timing of the switching operations, so that the SC attenuator is controlled by k-phase clock pulse 86.

FIG. 8 shows the time sequence of the operation. To prevent possible errors of the measuring result caused by a residual charge on capacitor 82, switch $\Phi_3$ is activated to discharge capacitor 82 prior to the charge transfer. Once TAC1 20 has performed a complete conversion and tristate drivers 28 of TAC1 20 are high-ohmic, switches $\Phi_1$ and $\Phi_{1S}$ are activated to connect capacitor 82 to charging capacitor 32 of TAC1 20. Charge $Q_1 = C_1 \cdot U_{TAC}$ present on charging capacitor 32 is distributed over capacitor 32 and capacitor 82 in such a way that the voltages are equalized across capacitors 32 and 82, i.e., $U_{TAC}$ and $U_{C2}$. Since capacitor 82 was discharged prior to the charge transfer, the sum of the charges on the two capacitors 32, 82 following the transfer is $Q'_1+Q'_2=Q_1$. Thus, the voltage on the two capacitors following the charge transfer is expressed as:

$$U_{C2}^1 = \frac{C_1}{C_1 + C_2} U_{TAC}$$

Thus, by properly selecting capacitances $C_1$ and $C_2$, the desired attenuation ratio is able to be set. In the case of prototype ASIC 1 described here, $C_1=C_2$ was selected, so than an attenuation of ½ is attained.

In addition, two switches $\Phi_1$ and $\Phi_{1S}$ are used, in order that the influence of parasitic capacitances be limited in the switches, for example. This is described in R. J. BAKER, H. W. LI, D. E. BOYCE: *CMOS Circuit Design, Layout, and Simulation*, IEEE Press Series on Microelectronic Systems, Wiley Interscience, 1998 and K. R. LAKER, W. M. C. SANSEN: *Design of Analog Integrated Circuits and Systems*, McGraw-Hill, 1994.

In addition, the charge injection is reduced by delaying the bringing of $\Phi_{1S}$ into circuit (compare FIG. 8). Once the charge transfer is complete, capacitor 82 is connected by switches $\Phi_2$ and $\Phi_{2S}$ to output buffer 44, so that voltage $U'_{C2}$ at output 46 of the be read out as a measure of the measuring time.

Within sequence control 84, the instants of the individual switching operations are able to be precisely set through the selection of the correct clock phase from k-phase clock pulse 86, making it possible to achieve an optimal timing which, on the one hand, allows ample time for the charge transfer, but, on the other hand, keeps the dead time of the TAC as short as possible. In addition, sequence control 84 ensures that switches $\Phi_1$, $\Phi_{1S}$ and $\Phi_2$, $\Phi_{2S}$, are never simultaneously closed.

It will be readily apparent to one skilled in the art that the above described specific embodiments are understood to be exemplary, and that the present invention is not limited thereto, but may be modified in diverse ways without departing from the scope thereof. It will also be clear that, regardless of whether the features are discussed in the specification, the claims, the figures or elsewhere, they also individually define essential parts of the present invention, even when they are described in conjunction with other features.

The invention claimed is:

1. A time-to-amplitude component having an integrated designed configured to measure a time difference between a start signal and a stop signal, wherein the time difference is converted into an analog voltage signal, the component comprising:
   a first time-to-amplitude converter including:
      a delay chain including a plurality of delay elements, each delay element having an associated delay time;
      a resistor network including a respective resistor for each of the delay elements;
      a capacitor coupled to the respective resistors and configured to be chargeable via the resistor network; and
      a respective driver for each of the delay elements, wherein each of the delay elements is coupled to the respective resistor via the respective driver, and
   a control device having a start input and a stop input and being coupled to the delay chain and the respective drivers; and
   a stabilizing device including a control circuit for generating a regulated control voltage and configured to stabilize a characteristic curve associated with the first time-to-amplitude converter, the first time-to-amplitude converter and the control circuit being integrated and interconnected, and
   wherein the first time-to-amplitude converter is configured so that:
      the delay elements of the first time-to-amplitude converter are controlled by the regulated control voltage,
      a run signal is transmitted through the delay chain in response to the start signal at the start input, and the capacitor is continuously charged via the resistor network in response to the run signal so that a capacitor voltage changes according to a propagation time, and
      the resistor network is electrically separated from the delay chain via the respective drivers so as to terminate a charging of the capacitor in response to the stop signal at the stop input, and the analog voltage signal dependent on the time difference between the start signal and the stop signal is measurable at an output of the capacitor.

2. The time-to-amplitude converter component as recited in claim 1, further comprising a second time-to-amplitude converter integrated on a chip in parallel with the first time-to-amplitude converter, the second time-to-amplitude converter including:
   a delay chain including a plurality of delay elements, each delay element having an associated delay time;
   a resistor network including a respective resistor for each of the delay elements;
   a capacitor coupled to the respective resistors and configured to be chargeable via the resistor network; and
   a respective driver for each of the delay elements, wherein each of the delay elements is coupled to the respective resistor via the respective driver,
   the delay chains of the first and second time-to-amplitude converters being configured to be controlled by the regulated control voltage generated by the control circuit.

3. The time-to-amplitude converter component as recited in claim 2, wherein the capacitors of the first and second time-to-amplitude converters are connected to a buffer via a switch having settings configured to alternately provide the analog voltage signal from one of the first and second time-to-amplitude converters, the other of the first and second time-to-amplitude converters being ready for measurement.

4. The time-to-amplitude converter component as recited in claim 3, further comprising a respective switched-capacitor attenuator for each of the time-to-amplitude converters, each of the switched-capacitor attenuators being configured to attenuate the respective analog voltage signal and including a respective sequence control, the switch-capacitor attenuators being configured to be controlled by a phase clock pulse generated by the stabilizing device and disposed between the respective time-to-amplitude converter and the buffer so that a switching of the switch provides an attenuated analog voltage signal of one of the first and second time-to-amplitude converters to be alternately readable at the buffer output.

5. The time-to-amplitude converter component as recited in claim 1, further comprising an attenuator configured to attenuate the analog voltage signal measureable at the output of the first time-to-amplitude converter.

6. The time-to-amplitude converter component as recited in claim 5, wherein the attenuator includes a sequence control controlled by a phase clock generated by the stabilizing device and configured to control the attenuator.

7. The time-to-amplitude converter component as recited in claim 5, wherein the attenuator is a switched-capacitor attenuator.

8. The time-to-amplitude converter component as recited in claim 7, wherein the switched-capacitor attenuator is configured to have points in time of switching operations thereof controlled by a selected clock phase from the phase clock pulse generated by the stabilizing device.

9. The time-to-amplitude converter component as recited in claim 7, wherein the switched-capacitor attenuator includes a capacitor and a plurality of switches controlled by the sequence control, the capacitor of the switched-capacitor attenuator being connectable in parallel to the capacitor of the first time-to-amplitude converter via a charging switch and being groundable to an output-side grounding circuit controlled by the sequence control, the capacitor being grounded after a delay relative to charging.

10. The time-to-amplitude converter component as recited in claim 1, wherein the control circuit includes a locked loop circuit including a respective delay chain having a plurality of respective delay elements and a phase detector,
   the phase detector is configured to generate the regulated control voltage for the first time-to-amplitude converter, and
   wherein the locked loop circuit is configured to supply the regulated control voltage to the first time-to-amplitude converter so that the delay elements of the locked loop circuit and the delay elements of the first time-to-amplitude converter are driven by the regulated control voltage.

11. The time-to-amplitude converter component as recited in claim 10, wherein the delay elements of the first time-toamplitude converter and the delay elements of the locked loop circuit include a common design.

12. The time-to-amplitude converter component as recited in claim 10, wherein the delay elements of the first time-to-amplitude converter and the delay elements of the locked loop circuit each include CMOS inverter pairs.

13. The time-to-amplitude converter component as recited in claim 10, wherein the locked loop circuit is a phase locked loop circuit and includes a ring oscillator having an odd number (2k+1) of inverters.

14. The time-to-amplitude converter component as recited in claim 10, wherein the locked loop circuit is a delay locked loop circuit and the delay chain of the locked loop circuit includes an even number (n=2*k) of inverters, each delay element of the locked loop circuit including a pair of inverters.

15. The time-to-amplitude converter component as recited in claim 14, wherein a delay time associated with the delay chain of the delay locked loop circuit corresponds to an integral multiple of a cycle time of an inputted clock signal.

16. The time-to-amplitude converter component as recited in claim 14, wherein a number of delay elements of the first time-to-amplitude converter is greater than or equal to a number of delay elements of the delay locked loop circuit.

17. The time-to-amplitude converter component as recited in claim 16, wherein the number of delay elements of the first time-to-amplitude converter is greater than the number of delay elements of the delay locked loop circuit.

* * * * *